US011880118B2

(12) United States Patent
Schickel et al.

(10) Patent No.: US 11,880,118 B2
(45) Date of Patent: Jan. 23, 2024

(54) METHOD OF DETERMINING A PATH ALONG AN OBJECT, SYSTEM AND METHOD FOR AUTOMATICALLY INSPECTING AN OBJECT

(71) Applicant: TOP SEVEN GMBH & CO. KG, Starnberg (DE)

(72) Inventors: Peter Schickel, Berg (DE); Ulrich Seng, Starnberg (DE); Oliver Neubauer, Gauting (DE)

(73) Assignee: TOP SEVEN GMBH & CO. KG, Starnberg (DE)

( * ) Notice: Subject to any disclaimer, the term of this patent is extended or adjusted under 35 U.S.C. 154(b) by 0 days.

(21) Appl. No.: 17/844,146

(22) Filed: Jun. 20, 2022

(65) Prior Publication Data
US 2022/0317546 A1    Oct. 6, 2022

Related U.S. Application Data

(63) Continuation of application No. 16/569,682, filed on Sep. 13, 2019, now Pat. No. 11,435,650, which is a
(Continued)

(51) Int. Cl.
*G03B 15/00*    (2021.01)
*G06F 30/15*    (2020.01)
(Continued)

(52) U.S. Cl.
CPC .......... *G03B 15/006* (2013.01); *B64C 39/024* (2013.01); *G05D 1/0027* (2013.01);
(Continued)

(58) Field of Classification Search
CPC ..... G03B 15/006; B64C 39/024; B64C 39/02; G05D 1/0027; G05D 1/106; G05D 1/0094;
(Continued)

(56) References Cited

U.S. PATENT DOCUMENTS 4,904,996 A    2/1990    Fernandes
7,574,035 B2    8/2009    Koonankeil
(Continued)

FOREIGN PATENT DOCUMENTS

CA    2 580 672 A1    10/2007
DE    44 36 197 C2    9/1998
(Continued)

OTHER PUBLICATIONS

European office action dated Jul. 25, 2022, issued in application No. EP 21170972.0.
(Continued)

*Primary Examiner* — Yonel Beaulieu
(74) *Attorney, Agent, or Firm* — McClure, Qualey & Rodack, LLP

(57) ABSTRACT

A method of determining a path along an object includes a step of "determining a reference point of the object in absolute coordinates", a step of "ascertaining a set of points of the object in absolute coordinates on the basis of further points of the object within a relative coordinate system, conversion of the further points of the object to the absolute coordinate system being effected on the basis of the reference point of the object", and a step of "determining the path along the object on the basis of the set of points of the object, so that the path extends at a distance from the object".

18 Claims, 8 Drawing Sheets

Related U.S. Application Data continuation of application No. PCT/EP2017/083355, filed on Dec. 18, 2017.

(51) Int. Cl.
  *B64C 39/02* (2023.01)
  *G05D 1/00* (2006.01)
  *G06T 17/00* (2006.01)
  *G07C 5/00* (2006.01)
  *G08G 5/00* (2006.01)
  *G06T 17/05* (2011.01)
  *G07C 5/08* (2006.01)
  *G05D 1/10* (2006.01)
  *B64U 101/00* (2023.01)

(52) U.S. Cl.
  CPC ............ *G05D 1/106* (2019.05); *G06F 30/15* (2020.01); *G06T 17/05* (2013.01); *G07C 5/0808* (2013.01); *G07C 5/0816* (2013.01); *G08G 5/0034* (2013.01); *B64U 2101/00* (2023.01)

(58) Field of Classification Search
  CPC ........... G05D 1/00; G06F 30/15; G06T 17/05; G07C 5/0808; G07C 5/0816; G08G 5/0034; G08G 5/0069; G08G 5/025; G08G 5/00; B64U 2101/00; B64U 2101/30
  See application file for complete search history.

(56) References Cited

U.S. PATENT DOCUMENTS

| | | | |
|---|---|---|---|
| 8,306,747 | B1 | 11/2012 | Gagarin et al. |
| 9,513,635 | B1 | 12/2016 | Bethke et al. |
| 9,612,264 | B2 | 4/2017 | Bruins et al. |
| 9,623,905 | B2 | 4/2017 | Shashua et al. |
| 10,054,110 | B2 | 8/2018 | Zell |
| 2006/0008137 | A1 | 1/2006 | Nagahdaripour et al. |
| 2009/0278353 | A1 | 11/2009 | Da Costa Duarte Pardal et al. |
| 2012/0136630 | A1 | 5/2012 | Murphy et al. |
| 2012/0271540 | A1 | 10/2012 | Miksa et al. |
| 2014/0046589 | A1 | 2/2014 | Metzler et al. |
| 2014/0168420 | A1 | 6/2014 | Naderhirn et al. |
| 2016/0004795 | A1 | 1/2016 | Novak |
| 2016/0216304 | A1* | 7/2016 | Sekelsky .............. B60L 53/126 |
| 2016/0292872 | A1 | 10/2016 | Hammond et al. |
| 2017/0132839 | A1 | 5/2017 | Ambrus et al. |
| 2018/0166920 | A1* | 6/2018 | Britz .................... H02J 50/12 |
| 2018/0204469 | A1 | 7/2018 | Moster et al. |
| 2018/0292531 | A1 | 10/2018 | Xie |
| 2018/0374353 | A1 | 12/2018 | Hosokawa et al. |
| 2020/0218979 | A1 | 7/2020 | Kwon et al. |
| 2020/0242922 | A1 | 7/2020 | Dulberg et al. |
| 2020/0257301 | A1 | 8/2020 | Weiser et al. |
| 2021/0101616 | A1 | 4/2021 | Hayat et al. |

FOREIGN PATENT DOCUMENTS

| | | |
|---|---|---|
| DE | 198 33 486 A1 | 2/2000 |
| DE | 699 08 664 T2 | 12/2003 |
| DE | 10 2005 017 865 B4 | 5/2007 |
| DE | 10 2008 042 287 A1 | 3/2010 |
| DE | 10 2010 014 358 A1 | 10/2011 |
| DE | 10 2011 017564 B4 | 10/2012 |
| DE | 10 2012 214 981 A1 | 2/2014 |
| DE | 10 2013 217 129 A1 | 3/2015 |
| DE | 20 2014 006 541 U1 | 11/2015 |
| DE | 10 2013 107 273 B4 | 3/2017 |
| EP | 1 230 556 A1 | 8/2002 |
| GB | 2 312 580 A | 10/1997 |
| JP | 2006-027448 A | 2/2006 |
| KR | 10-2010-0000903 A | 1/2010 |
| WO | 2005/033629 A2 | 4/2005 |
| WO | 2009/142933 A2 | 11/2009 |
| WO | 2011/113402 A1 | 9/2011 |
| WO | 2013/167221 A1 | 11/2013 |
| WO | 2014/023404 A1 | 2/2014 |
| WO | 2015/082405 A1 | 6/2015 |
| WO | 2016/059785 A1 | 4/2016 |
| WO | 2016/149513 A1 | 9/2016 |
| WO | WO-2016190909 A2 * | 12/2016 ............ B60L 11/182 |
| WO | WO-2017210365 A1 * | 12/2017 ............ G01R 33/00 |

OTHER PUBLICATIONS

Bircher, A., et al.; "Structural inspection path planning via iterative viewpoint resampling with application to aerial robotics;" 2015 IEEE International Conference on Robotics and Automation (ICRA); May 2015; pp. 6423-6430.

Schafer, B.E., et al.; "Multicopter unmanned aerial vehicle for automated inspection of wind turbines;" 2016 24th Mediterranean Conference on Control and Automation (MED); Jun. 2016; IEEE; pp. 244-249.

Eschmann, C., et al.; "Nahfeldnavigation unbemannter Flugsysteme zur Inspektion von Infrastrukturen;" Dissertation, Rheinisch-Westfälische Technische Hochschule Aachen, Nov. 2016; pp. 1-182.

Alexis, K., et al.; "Uniform coverage structural inspection path-planning for micro aerial vehicles;" 2015 IEEE International Symposium on Intelligent Control (ISIC); Sep. 2015; pp. 59-64.

Jing, W., et al.; "Sampling-based view planning for 3D visual coverage task with Unmanned Aerial Vehicle;" 2016 IEEE/RSJ International Conference on Intelligent Robots and Systems (IROS); Oct. 2016; pp. 1808-1815.

International Search Report dated Dec. 18, 2017, issued in application No. PCT/EP2017/083355.

European Office Action, dated Dec. 14, 2020, in application No. 17 828 706.6.

European Office Action dated Jun. 25, 2021, issued in application No. EP 21170972.0.

Opposition dated Apr. 14, 2022, issued in patent No. EP 3596570.

Thrun, S., et al.; "Scan Alignment and 3-D Surface Modeling with a Helicopter Plattform;" The 4th International Conference on Field and Service Robotics; Jul. 2003; pp. 1-6.

Chinese language office action dated May 5, 2022, issued in application No. CN 201780090768.4.

English language translation of office action dated May 5, 2022, issued in application No. CN 201780090768.4 (pp. 1-9 of attachment).

Zhang, G., et al.; "Design and Implementation of Sample-By-Sample Modeling in 3-Dimensional GIS;" Mapping and Spatial Geography information; Geomatics and Spatial Information Technology; vol. 33; No. 2; Apr. 2010; pp. 132-135.

English language translation of "Design and Implementation of Sample-By-Sample Modeling in 3-Dimensional GIS" (pp. 1 of publication).

Chinese language office action dated Oct. 24, 2022, issued in application No. CN 2017800907684.

English language translation of office action dated Oct. 24, 2022, issued in application No. CN 2017800907684 (pp. 1-8 of attachment).

European language Decision in Opposition Procedure dated Jun. 6, 2023, issued in patent No. EP 3596570.

* cited by examiner

METHOD OF DETERMINING A PATH ALONG AN OBJECT, SYSTEM AND METHOD FOR AUTOMATICALLY INSPECTING AN OBJECT

CROSS-REFERENCES TO RELATED APPLICATIONS

This application is a continuation of U.S. application Ser. No. 16/569,682, filed Sep. 13, 2019, now U.S. Pat. No. 11,435,650, which is a continuation of International Application No. PCT/EP2017/083355, filed Dec. 18, 2017, which is incorporated herein by reference in its entirety, and additionally claims priority from German Applications Nos. DE 10 2017 204 242.7, filed Mar. 14, 2017, and DE 10 2017 205 647.9, filed Apr. 3, 2017, both of which are incorporated herein by reference in their entireties.

The present invention relates to a method of determining a path along an object and to a system and a method for automatically inspecting an object. Embodiments relate to a camera drone which automatically flies a distance along an object so as to take photos of the object and to detect potential damage. Further embodiments show flight path scheduling on the basis of 3D CAD (computer-aided design) models interlaced with geographic GPS (global positioning system) data.

BACKGROUND OF THE INVENTION

Up to now, cameras installed on, e.g., drones for inspecting objects have been remote-controlled by a pilot. However, this has given rise to various disadvantages. For example, monitoring of the drone's position can only be effected in a merely visual manner, without any electronic tools. The pilot tracks the camera with his/her eyes and controls same from the ground. Particularly with objects that are far away, e.g., the blades of a wind turbine, this is difficult for the pilot to accomplish since for one thing, the camera becomes very small and sometimes is hardly visible and since, in addition, the head may be laid back far when objects are positioned at large height. Controlling the camera by means of a monitor displaying the camera image also is no remedy since the only view available here is the first-person view of the camera rather than a top view of the drone. In addition, both methods have the disadvantage that a specific location, for example where a defect has been recognized, can only be flown to again with a mere guess at its distance so as to inspect the location in more detail. In addition, with this manual control, the drone can neither be positioned at a constant distance from an object, nor can the camera be precisely aligned with the object, nor can exact trigger points of a camera for taking pictures of the object be defined. Thus, measuring (or dimensioning), i.e., determining a magnitude of possible errors, is rendered more difficult since the field of view of the image is not known.

SUMMARY

According to an embodiment, a method of determining a path along an object may have the steps of: determining a reference point of the object in absolute coordinates; ascertaining a set of points of the object in absolute coordinates on the basis of further points of the object within a relative coordinate system, conversion of the further points of the object to the absolute coordinate system being effected on the basis of the reference point of the object; determining the path along the object on the basis of the set of points of the object, so that the path extends at a distance from the object.

According to another embodiment, a system for automatically inspecting an object may have: a movable capturing unit configured to automatically move on a path along the object; and a calculating unit configured to determine a reference point of the object in absolute coordinates; ascertain further points of the object in relation to the reference point so as to obtain a set of points of the object in absolute coordinates; and determine the path along the object on the basis of the set of points of the object, so that the path extends at a distance from the object; wherein the movable capturing unit is configured to inspect the object along the path.

According to another embodiment, a computer program may have a program code for performing the inventive method, when the program runs on a computer.

Embodiments show a method of determining a path along an object. The method includes a step of "determining a reference point of the object in absolute coordinates (e.g. coordinates within a global coordinate system)", a step of "ascertaining a set of points of the object in absolute coordinates on the basis of further points of the object within a relative coordinate system, conversion of the further points of the object to the absolute coordinate system being effected on the basis of the reference point of the object", and a step of "determining the path along the object on the basis of the set of points of the object, so that the path extends at a distance from the object".

In other words, the relative coordinates may be construed as coordinates within a first coordinate system. By analogy, the absolute coordinates may be construed as coordinates within a second coordinate system, the first coordinate system differing from the second coordinate system. The path, or the coordinates of the path, will then exist, e.g., in coordinates of the second coordinate system so as to enable, e.g., a movable capturing (picture-taking) unit to follow the path, as will be described in subsequent embodiments. In embodiments, the movable capturing unit may measure, or determine, coordinates of the second coordinate system rather than coordinates of the first coordinate system.

The present invention is based on the idea of automating inspection of objects. To this end, it is initially important that a route along an object be determined along which the object may be inspected. Here it is important at first to determine the exact position of the object. Frequently, however, dimensioning is known only from, e.g., dimensional drawings or (3D) computer models of the object, whereas absolute coordinates of, e.g. a geographic coordinate system, of the object are not known. Said coordinates will also be referred to as relative coordinates below. In order to obtain the absolute coordinates, it will suffice, however, to determine only one point of the object in absolute terms and to transform the further points in relative coordinates to absolute coordinates on the basis of the reference point. Thus, expensive position finding of a multitude of reference points may be avoided. The absolute coordinates may then be used for finding the position of the path, so that also the (corner) points of the path (or polygon) are available in absolute coordinates.

In embodiments, coordinates of the path are determined in relation to at least one point among the set of points (or in relation to the object). This means that the points of the path are available in absolute coordinates; however, they are not fixed (or constant) but may follow a movement of the object. For example, wind turbines are typically rotated into the wind even when they are not in operation. If the path of a movement of the rotor (or of the wind turbine) is tracked, said path will typically be at the same position in relation to the wind turbine, i.e., to the rotor blades, for example. The movement of the wind turbine may be determined by means of a deviation of the position of the reference point between ascertaining the set of points in absolute coordinates and the current position of the reference point. Since the reference point advantageously is located on the (outer) surface of the object, said reference point will move along even as the object rotates. The axis of rotation of the object is typically located inside the object. If the object may move both in a translational and in a rotational manner, two reference points may further be determined on the object.

In embodiments, the path, e.g., a trajectory, on which a moveable unit, e.g., a drone, moves along the object, is specified on the basis of a 3D or lattice (mesh) model of the object. The local coordinates of the model are converted, via the at least one reference point, to absolute coordinates for controlling the moveable unit by means of the absolute coordinates (e.g. GPS coordinates). In such embodiments, a movement of the object or of part of the object, e.g., of a rotor blade of a wind turbine, may be reproduced in the model in real time, so that on the basis of the modified model, the trajectory is adapted to the movement of the object in real time as well. Those points of the trajectory which are affected by the movement of the object are adapted, e.g., on the basis of the coordinates of the modified model. The movement of the object may either be a continuous or ongoing movement of the object or of part of the object, e.g., rotor blades of a wind turbine which rotate in the wind, or it is a change of orientation of the object or of part of the object, e.g., the movement of a decoupled rotor blade of a wind turbine from a first position to a second position, which is caused by a gust of wind, for example.

In other embodiments, the object may be an airplane to be inspected. In such an embodiment, the movement of the object which was mentioned above may be the movement of the tail unit of the airplane from a first position to a second position, which is caused by a gust of wind, for example.

In accordance with embodiments, reproducing said movements in the model provides the possibility of adapting the trajectory along the object to the changing conditions in real time. In accordance with embodiments, a movement of the unit, e.g., of the drone, along the moving object or along the moving part of the object is made possible.

Determining of the coordinates in relation to the object may be effected by determining the path by means of a distance that is to be kept from the object. Here, the distance from the object may be ascertained in a direction perpendicular to polygon surfaces located between the set of points of the object. Said method enables optimum positioning of the path to the object to be captured so as to perform, e.g., picture-taking or measurements along the path of, or on, the object. In addition or alternatively, the path may also be determined such that at least 40%, at least 60% or at least 80% of the total length of the path extends in parallel with polygon surfaces located between the set of points of the object. Polygon surfaces may connect adjacent points/vertices so as to span the surface of the object and to create a model of the object.

Embodiments further show that determining the path includes manually inputting the path in relative coordinates. The relative coordinates of the path may then be converted to absolute coordinates so as to obtain the path (or coordinates thereof) in absolute coordinates. In other words, manual inputting of coordinates of the path is also possible. Said coordinates may be input via a CAD system, i.e., they may be input along the 3D model. Input of the coordinates may be effected in an entirely manual manner, i.e., without any previously (automatically) calculated path. Additionally or alternatively, an existing path may be manually changed by, e.g., shifting individual coordinates of the path. Thus, the path may be dynamically adapted even while, e.g., an automatic capturing means is moving along the path.

In embodiments, ascertaining of the set of points is preceded by creating a 3D representation of the object within the relative coordinate system. This is advantageous, for example, when no 3D model of the object exists as yet but if there is only a dimensional drawing or if there no dimensions of the object are known. If indications of measurements are missing, they may be ascertained in advance, or an interpolation may be effected between at least 2 points. For example, with a cylinder-shaped object, the surface may be interpolated from a known diameter or radius. By analogy, this may be transferred to other shapes of the object. If the set of points on the surface of the object is known from the 3D model in absolute coordinates, (i.e. in relation to the reference point), the path now can be ascertained more readily, for example by means of any of the previously described embodiments.

Embodiments further show a method of automatically inspecting an object while using the above-described method. In addition, the method includes automatically moving a movable capturing unit on a path along the object and creating a sequence of images of the object in order to inspect the object. This method may be performed by the system which will be described below.

Embodiments further show a system for automatically inspecting an object. The system comprises a movable capturing unit configured to automatically move on a path along the object. In addition, the system comprises a calculating unit configured to determine a reference point of the object in absolute coordinates, ascertain further points of the object in relation to the reference point so as to obtain a set of points of the object in absolute coordinates, and determine the path along the object on the basis of the set of points of the object, so that the path extends at a distance from the object. The movable capturing unit now can inspect the object along the path. To this end, the movable capturing unit may comprise a position determiner (position sensor) (e.g., GPS receiver) which measures the absolute coordinates. The movable capturing unit may then minimize a distance between the path (or between a point that is to be targeted on the path) and an ascertained position of the position sensor so as to move the movable capturing unit along the path and to inspect the object from the points along the path. This automated displacement (or movement) of the capturing unit also results in that the movable capturing unit may be automatically controlled to move to any point of the path and, therefore, to any location of the object so as to take measurements at the point, for example, or to create a picture of a specific location of the object. For example, in embodiments, a drone may fly along the object (e.g., the wind turbine) during a general survey flight. A potential defect may then be seen in the pictures, which will not be clearly discernable in the general survey picture, however. To increase the resolution of the image at that location, the moveable capturing unit may be equipped with a different objective (which has a larger focal length) or may fly to a point that is closer to the object than the original trigger point so as to create a close-up picture of the potential defect.

In accordance with embodiments, the movable capturing unit is configured to create a sequence of pictures of the object or to perform a measurement on the object in order to inspect the object. The pictures may be taken by means of any imaging method. As measurements, e.g., contactless measurements may be considered, e.g., a conduction test of a lightning arrester, wherein a current is induced into the lightning arrester in a contactless manner, or also a distance measurement, e.g., by means of capacitive or inductive sensors which may detect surface defects, for example. Temperature measurements of a point, e.g., by means of an infrared thermometer or a (imaging) thermographic camera may be considered. In addition, contact-based sensors may also be used. For example, a conduction test of the lightning arrester may alternatively also be performed by means of a sliding contact, i.e., a brush or a broom, wherein it is via the sliding contact that a voltage may be applied to or a current may be impressed into the lightning arrester. The movable capturing unit may then be understood to take pictures of the measurements. Alternatively, a voltage may be applied to the lightning arrester externally (e.g., via a corresponding test system at the tip of a wind turbine). The movable capturing unit will then be configured to measure a field strength present within the lightning arrester.

Embodiments further show the calculating unit which is configured to define, along the path, trigger locations for the movable capturing unit as a function of a visual field of the movable capturing unit. The visual field of the movable capturing unit may be influenced and/or set, e.g., by the focal length and/or resolution of an objective of the capturing unit. In other words, the visual field may be a section of the environment which may be captured by the movable capturing unit. The movable capturing unit is configured to take (or capture) a picture at the trigger locations. This is advantageous since consequently, the number of pictures that may be used is specified in advance, for example on the basis of the objective used and/or of the distance of the path (i.e., of the movable capturing unit) from the object. Said specification may advantageously be performed in local terms, so that the capturing unit will trigger (release the shutter) upon reaching a trigger location rather than at random within specific time intervals. Thus, the number of images (or pictures) may be reduced to a minimum. This may amount to less than 100 pictures, less than 60 pictures or less than 40 pictures for a blade/vane of a wind turbine in order to inspect same from both sides. This reduces the expenditure in terms of evaluating the pictures as compared to uncontrolled triggering, or triggering based on mere time intervals (or even a video).

In embodiments, the system comprises an evaluating unit configured to project the images of the object onto a model of the object so as to obtain a model having the current surface of the object. Thus, the pictures taken may be superimposed on the existing or created 3D model, for example. Said projection (or superposition) may take place, in embodiments, on the basis of a current position and of a capturing direction of the capturing unit at a time of picture taking. By means of their absolute positions, the images may thus superimpose the object, whose absolute position of the set of points (or of the absolute position of its surface) is known. The absolute positions of the pictures may be determined from the real position of the capturing unit and from an alignment of the capturing unit. On the basis of a deviation of the position of the capturing unit during capturing of the image from the envisaged trigger location, image defects (aberrations) (e.g., perspective distortions) of the pictures taken may be compensated for by the deviation in the camera angle.

In accordance with embodiments, the movable capturing unit is configured to set a capturing direction to a point among the set of points. In other words, the movable capturing means aligns a camera such that the latter is aligned to a predetermined point of the object and will take a picture in said direction, irrespective of a current (absolute or spatial) position of the movable capturing means. In yet other words, the heading of the capturing means is aligned to the predetermined point of the object. This ensures that the movable capturing unit will capture the desired image section rather than being turned away from the object, for example. In addition, in this manner, even relatively large deviations of the capturing unit from a predetermined trigger location may be tolerated since successive images will overlap (approximately by a set value) and since, therefore, pictures will be obtained from all locations of the objects without omitting a surface area that should be captured. Potentially occurring aberrations (which are due to the fact that the object is not captured at right angles, but in an oblique manner, i.e., at an angle deviating from the right angle) may be compensated for. However, if a surface area of the object is not captured, the movable capturing unit may once again fly to said location so as not to have to do without information about this surface area.

In other words, the movable capturing unit may determine any selection, i.e., a subset or any value, from the subsequent measuring values: a (current) absolute (e.g., GPS) position of the movable capturing unit, a (current) target position (e.g., GPS) on the path, an alignment (heading) of the movable capturing unit, said alignment including rotation along a longitudinal axis of the movable capturing unit (roll), rotation along a transverse axis (pitch) and/or rotation along a vertical axis (yaw). In embodiments wherein the movable capturing unit includes a camera mounted on a (controllable) means of locomotion (e.g., drone, robot, submarine, airplane, etc.), alignment both of the movable object and of the camera itself may be sensed; the camera itself (independently of the movable object) may be rotated about at least one axis. On the basis of this data, an angle of the camera toward the object may be set such that the camera is aligned to a predefined point of the object. By means of the set angle of the camera (in terms that are absolute toward the object or relative to the means of locomotion), the captured image may further be equalized and/or processed in such a manner as if it had been captured from the front, i.e. (approximately) at an angle of 90° in relation to the object.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
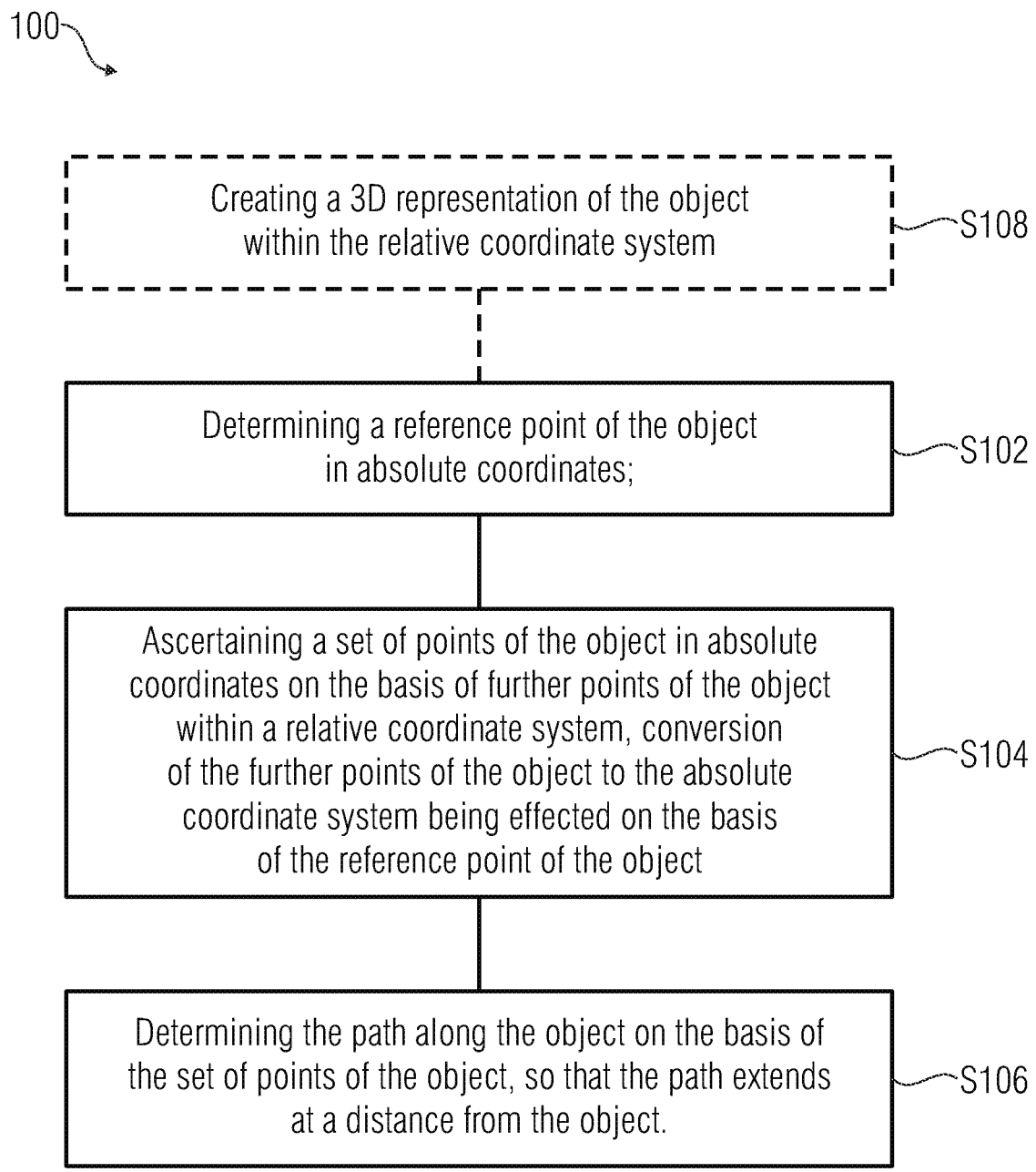
FIG. 1 shows a schematic block representation of a method of determining a path along an object.

In the description of the figures which follows, elements which are identical or identical in action will be provided with identical reference numerals, so that their descriptions in the different embodiments are mutually exchangeable.

FIG. 1 shows a schematic block representation of a method 100 of determining a path along one or more objects; to simplify matters, one single object shall be used as the basis without prejudice to the general validity. The path is a flight route, a travel route, a diving route, etc., for example, and in embodiments it is (or its points are) determined in three dimensions, or directions in space. The method 100 comprises the steps S102, S104 and S106. Step S102 includes determining a reference point of the object in absolute coordinates. The absolute coordinates are GPS coordinates, for example, i.e., coordinates within a coordinate system related to the Earth and/or an absolute geographic coordinate system (geo-centered coordinate system, GCC). The absolute coordinates may be determined with a deviation of less than 10 cm, less than 1 cm or less than 0.5 cm. This may be achieved, e.g., while using RTK (real time kinematic) systems for measuring which may achieve an accuracy of, e.g., one centimeter or more, or better.

Step S104 includes ascertaining a set of points of the object in absolute coordinates on the basis of further points of the object within a relative coordinate system, conversion of the further points of the object to the absolute coordinate system being based on the reference point of the object. The set of points may comprise the reference point and further points. In other words, lattice (mesh) points of the object may form the set of points of the object. For each (relevant) lattice point, the absolute coordinates (e.g., GPS coordinates) are known or are ascertained. Relevant lattice points may be such lattice points which face the path. In other words, the lattice point density of the object and/or of the surface of the object for which the absolute coordinates are determined may be larger at an area facing the path than in other areas of the object at which the path does not (directly) pass. The further points (or vertices) may be (lattice) points of the outer casing and/or of the surface of the object.

The relative coordinate system may be, e.g., the CAD coordinate system in which the 3D model is present. Alternatively, simple dimensioning (i.e., indications of measurements and/or sizes of the object) may also be regarded as a relative coordinate system. In other words, the relative coordinate system is introduced by way of demarcation from the absolute coordinate system so as to illustrate that navigation within the relative coordinate system is not possible.

Step S106 includes determining the path along the object on the basis of the set of points of the object, so that the path extends at a distance from the object.

Optionally, the method 100 may comprise a further step S108. Step S108 includes creating a 3D representation of the object within the relative coordinate system. This is followed by determining the set of points of the object. Thus, step S108 may be performed prior to or in parallel with step S102 or prior to step S104. Creation of the 3D representation may be effected by using CAD systems.

Figure 2:
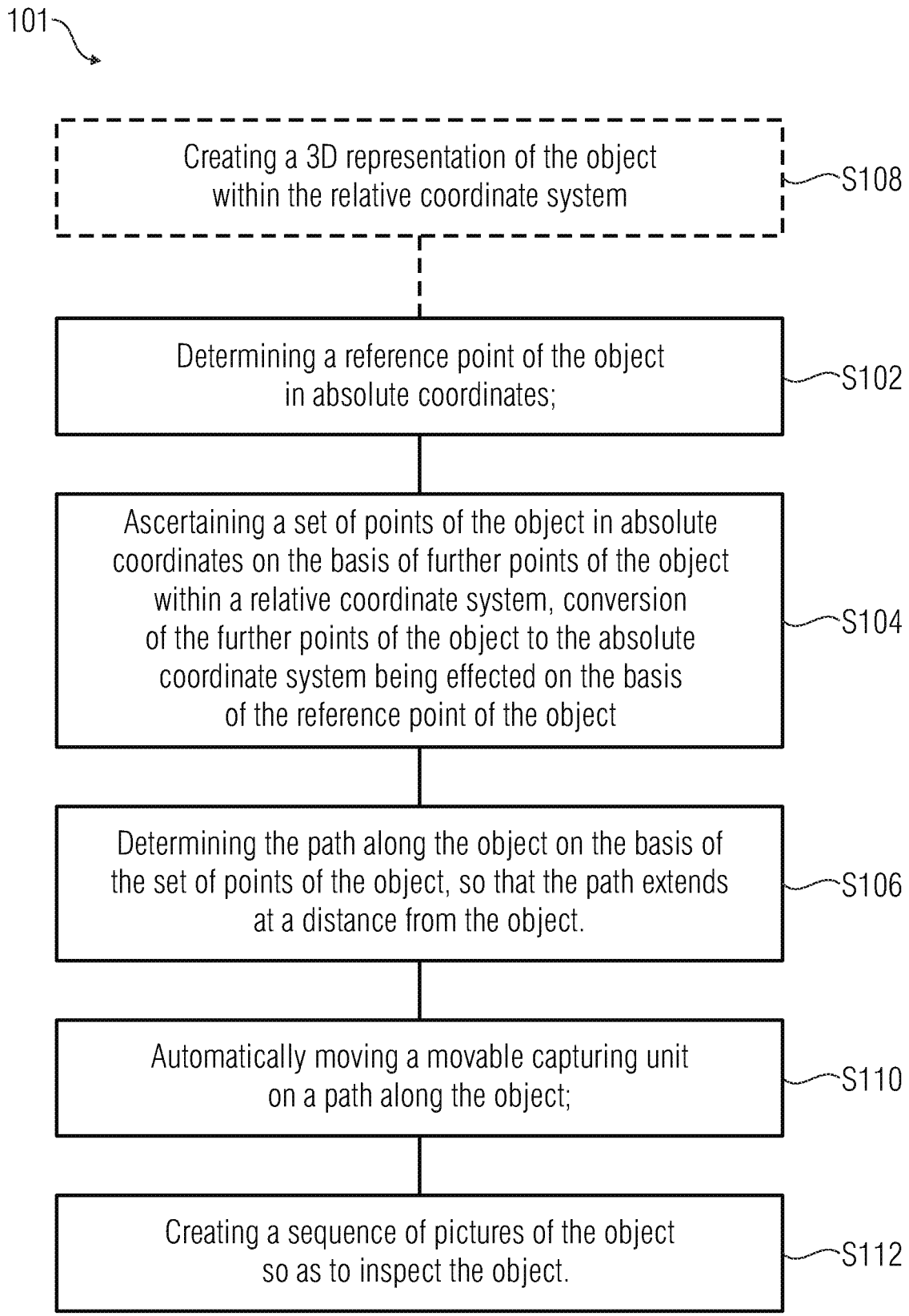
FIG. 2 shows a schematic block representation of a method of automatically inspecting an object.

FIG. 2 shows a schematic block representation of a method 101 of automatically inspecting an object. The method 101 comprises the steps of method 100. These are steps S102, S104, S106, and optionally S110. By way of supplementation, the method 101 comprises steps S110 and S112. Step S110 includes automatically moving a movable capturing unit on a path along the object. Step S112 further includes inspecting the object along the path. For inspecting the object, a sequence of images of the object may be created, or measurements may be made on the object, such as a conduction test of a lightning arrester, for example. In addition, in the method the steps may be performed by analogy with the features of the system described below.

Figure 3:
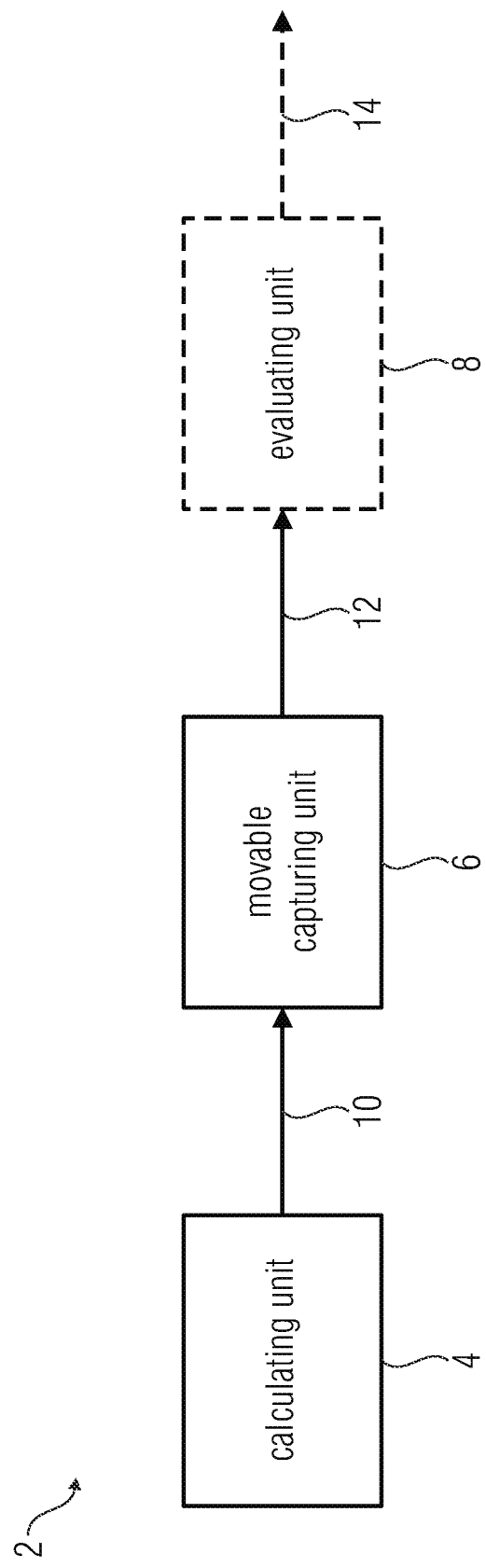
FIG. 3 shows a schematic representation of a system for automatically inspecting an object.

FIG. 3 shows a schematic block representation of a system 2 for automatically inspecting an object. The system 2 comprises a calculating unit 4 and a movable capturing unit 6. The calculating unit 4 is configured to determine a reference point of the object in absolute coordinates, to ascertain further points of the object in relation to the reference point so as to obtain a set of points of the object in absolute coordinates, and to determine the path 10 along the object on the basis of the set of points of the object, so that the path extends at a distance from the object. In other words, the calculating unit is configured to perform the method steps of method 100. In addition, the calculating unit may be arranged centrally, i.e., e.g., with a pilot or within a computing center, so as to initially determine the path once. The movable capturing unit may then store the path. If it is desired to track the path because the object moves (during measurement or in between creating the initial path or determining the reference point and the beginning of the inspection of the object), the movable capturing unit may be connected to the calculating unit or may comprise a calculating subunit so as to be able to track the path to its original position, e.g., in accordance with the deviation of the reference point from its current position. The movable capturing unit may further have a receiver for the absolute positional data (e.g., GPS) arranged therein.

The movable capturing unit 6 may further inspect the object along the path. During or after inspection, the capturing unit 6 may output an output signal 12. In embodiments, inspection of the object includes creating a sequence of images of the object or performing a measurement on the object. Thus, the output signal 12 may be an image, or a sequence of images, or one (or more) measuring results. The capturing unit may consequently be a camera which is attached, e.g., to a drone or a robot, etc., to render it movable.

The term "movable" here refers to the possibility of displacing the capturing unit along a path, or to follow the path. Movability may extend to any direction in space. The movable capturing unit may be a robot, boat, submarine, drone, airplane, etc., and be equipped with a (photo) camera. The camera may take pictures by means of any imaging method (time of flight, X-ray, photography, etc.). As an alternative to the camera, sensors may be used for determining/capturing characteristics of the object.

Optionally, the system 2 further comprises an evaluating unit 8 which evaluates the output signal 12. If the movable capturing unit has captured a sequence of images of the object, the evaluating unit 8 may project said images onto a model of the object so as to obtain a model 14 having the current surface of the object. Thus, the current surface is formed by the images taken. The sequence of images may be a video, photos, thermal images, X-ray photographs, time-of-flight images, etc.

Said projecting may be performed on the basis of the GPS data, i.e., of the absolute coordinates of the images and/or of the position of the movable capturing unit. To this end, the pictures taken may be provided with the GPS coordinates of the trigger locations (=evaluating unit) (with an RTK accuracy of approx. 1 cm, for example), so that the textures may be projected onto the GPS coordinate model (3D model).

Figure 4:
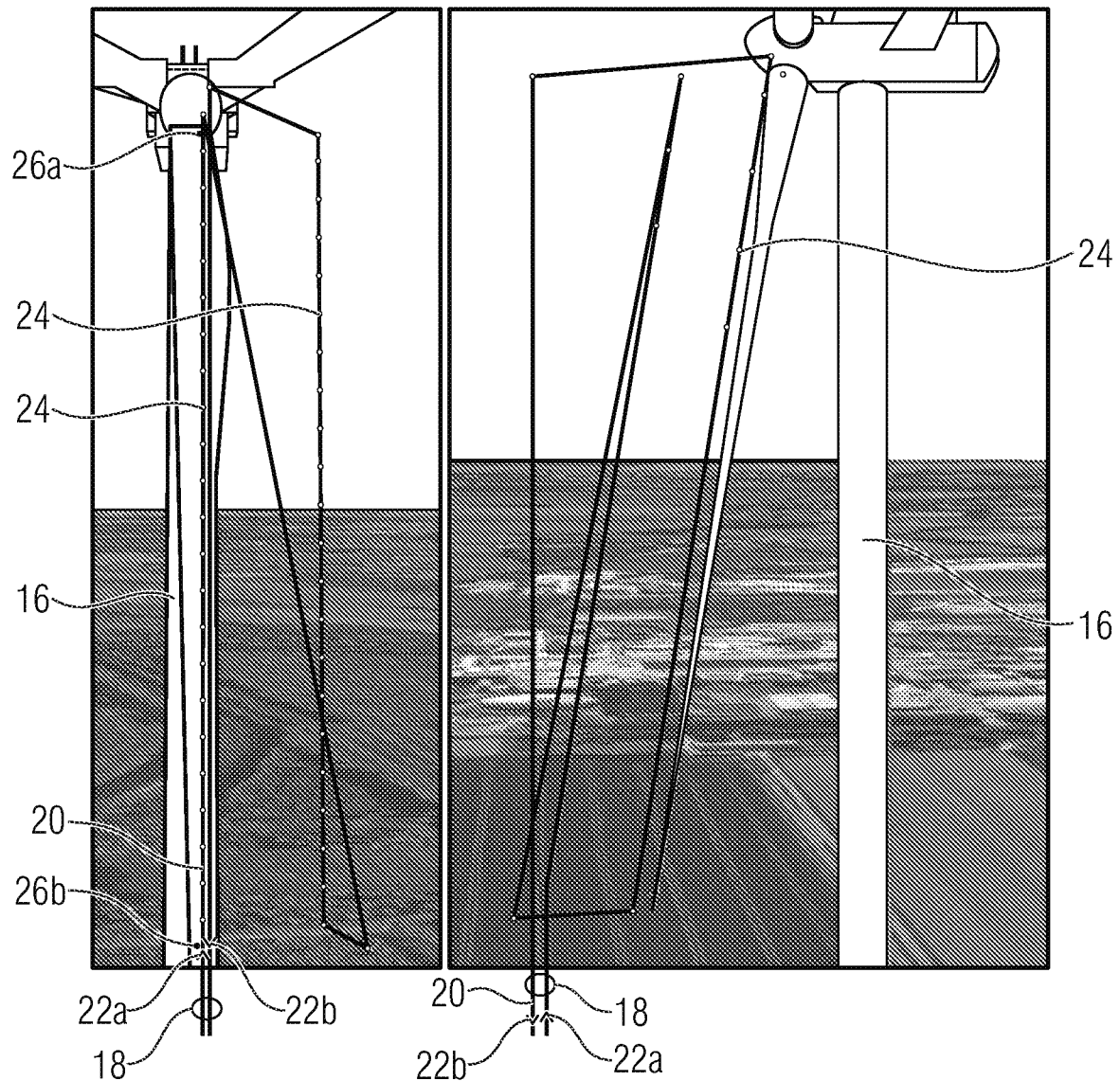
FIG. 4 shows a schematic representation of a path along an object in accordance with an embodiment.

FIG. 4 shows a schematic representation of the system in the example of a 3D representation of a wind turbine (or of blades of the wind turbine) as the object 16. In addition, a drone and/or an unmanned flying object is schematically shown as the movable capturing unit 18. However, both the object 16 and the movable capturing unit 18 may be interchanged at random. It is only by way of example that a submarine be mentioned as the movable capturing unit 18, which submarine automatically inspects an object under water along a path. Navigation, i.e., determining the current position of the submarine, may be effected, e.g., by relaying the GPS signal, the GPS signal being converted to a signal of a wavelength at which it may propagate (far enough) under water.

In FIG. 4, the embodiment has been captured from two different perspectives, which also reveal the spatial orientation of the path 20. The movable capturing unit 18 is shown at the beginning of the path 20. The arrows 22a and 22b show an exemplary direction of flight/direction of movement of the movable capturing unit 18 on the path 20. In addition, trigger locations 24 are drawn in as marks and/or dots on the path 20. The dots/trigger locations (or a point density/trigger location density on the path) may be determined by means of a visual field of the movable capturing unit, i.e., for example, by means of an objective that is used in the movable capturing unit (i.e. as a function of the focal length), e.g., such that two successive images will partly superimpose each other. Thus, deviations in positioning of the movable capturing unit, which would not be captured if the transitions between the frames were calculated too tight, may be compensated for. Optionally, the distance of the path may also be included in said determining step. At said trigger locations, the movable capturing means may create a picture of the object. Of course, it is also possible to take a video or at least a multitude of frames which are not optimized in accordance with the above-described method; however, this may increase the complexity of evaluation.

The trigger points may be selected, e.g., such that when using a 35 mm objective with a full-frame sensor, there will be a distance of 5 meters between the trigger points, when a distance of the path from the object is 6 meters and the object has a length of 60 meters.

In addition, FIG. 4 depicts two points 26a and 26b from the set of points. On the basis of the points of the set of points, coordinates of the path may be determined in relative terms. Embodiments further use polygon surfaces among the set of points from which the path has a distance in its extension. The distance may be specified, for example, such that a sudden gust of wind (or any other unpredictable event which may get the movable capturing unit off the path) cannot press the movable capturing unit against the object (or at least clearly reduces the likelihood thereof) before the movable capturing unit may compensate for, or equalize, the sudden change.

In other words, FIG. 4 represents automatically created waypoint scheduling on the basis of what were originally CAD and GEO data for optical inspection of wind power plants. In this context, a software (automatically) calculates the air route (distance from the blade of the wind turbine) of the drone and the trigger points for camera shots (points 24) as a function of the focal length of the camera objective that has been used. On account of the high-precision pictures and the high-precision referencing between CAD and GPS data, the images obtained are thereafter again projected onto a rotor blade CAD model and yield a fully textured 3D model of the object under observation. Prerequisite is the CAD model of the wind power plant or the like as well as a single GPS anchor point (e.g., at the base of the plant, base point) that is measured with high precision, on the basis of which conversion of the coordinate systems may be effected fast and automatic.

In FIG. 4, the camera drone (=movable capturing unit) takes pictures only when flying upward along the wind turbine blade. However, the embodiments are not limited thereto.

In addition, it is shown that the drone takes pictures of the wind turbine blade from two different perspectives. In embodiments, a portion of the path located between capturing of the wind turbine blade from the first perspective and from the second perspective may be input manually. Said input may be effected directly via the CAD software. Conversion of the relative coordinates in the software to the absolute coordinates may be automatic. In addition, input may also be effected when the drone is already in flight. The path will then be changed dynamically.

Figure 5A:
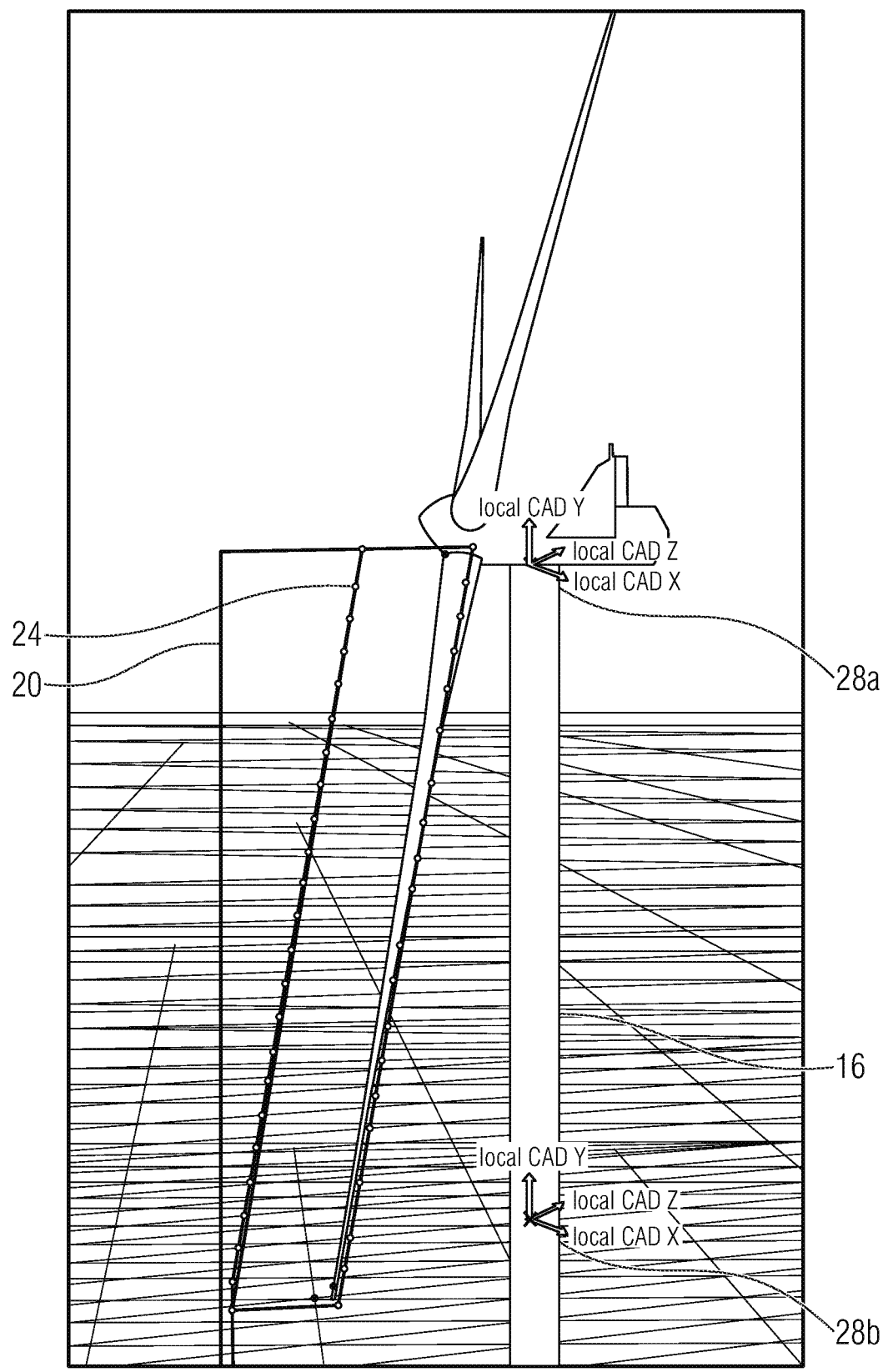
FIG. 5 shows a schematic representation of converting points of an object in relative or local coordinates (FIG. 5a) to absolute coordinates (FIG. 5b) by using an embodiment.
Figure 5B:
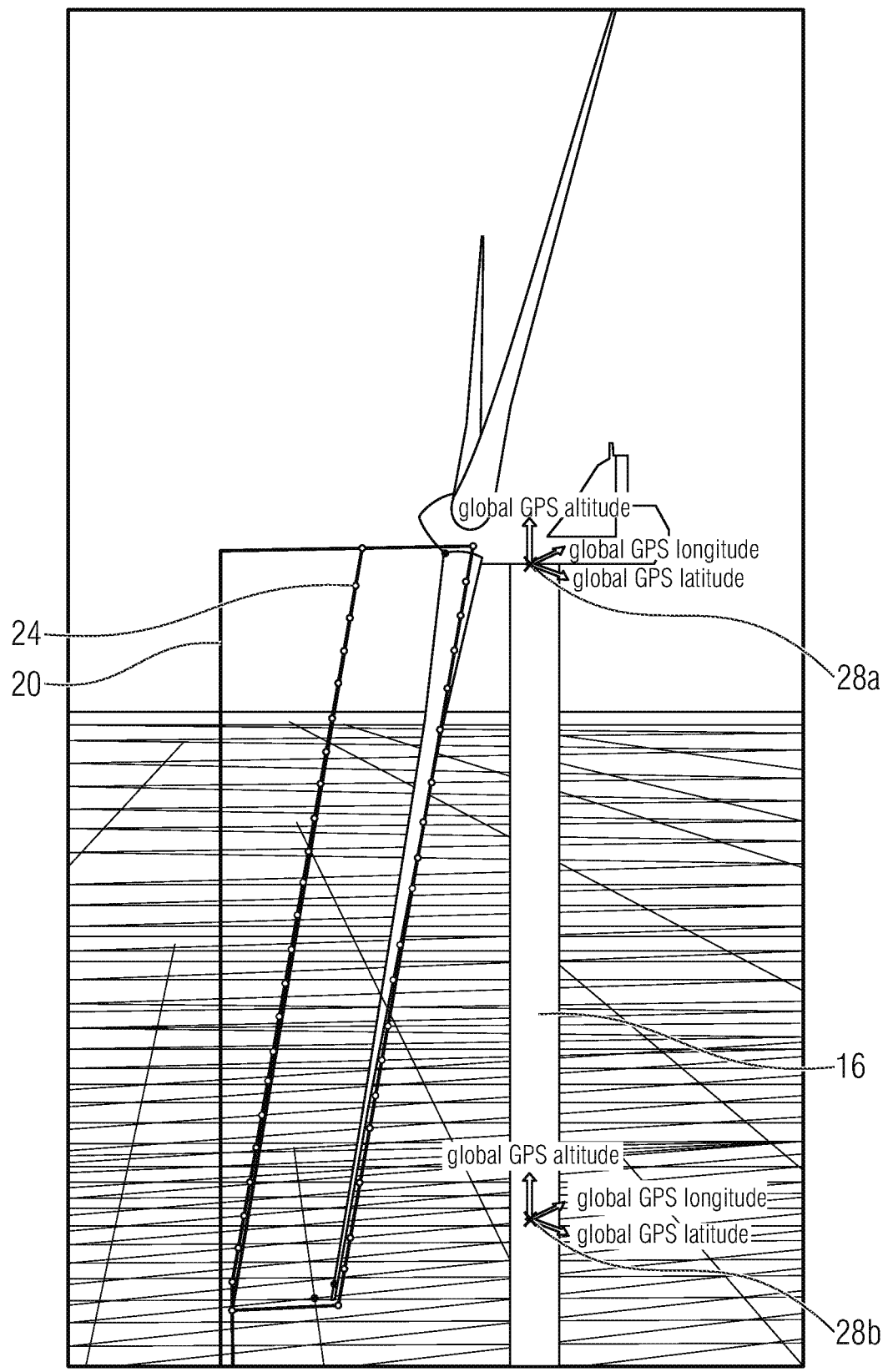

FIG. 5, i.e. FIG. 5a and FIG. 5b, shows the embodiment of FIG. 4. FIG. 5a schematically shows the 3D representation of the object in relative coordinates, for example in (local) CAD coordinates. This is indicated, by way of example, at two points 28a, 28b of the object by means of the coordinate axes designated by local CAD. However, the movable capturing unit cannot navigate on the basis of said coordinates, which may also be only dimensions and/or vectors, e.g., along a surface of the object. To this end, it is advantageous to transform the set of points, or at least a sufficient subset thereof, to the absolute coordinates. The result is illustrated in FIG. 5b by points 28a, 28b which are now present within the absolute coordinate system, i.e., bear GPS coordinates, as indicated in FIG. 5b, for example. The GPS coordinates may be subdivided into components of a rectangular coordinate system whose axes may be designated by geographical altitude, geographical latitude and geographical longitude. The movable capturing unit may measure said absolute coordinates itself and will therefore know its current position and its position in relation to the object.

Figure 6:
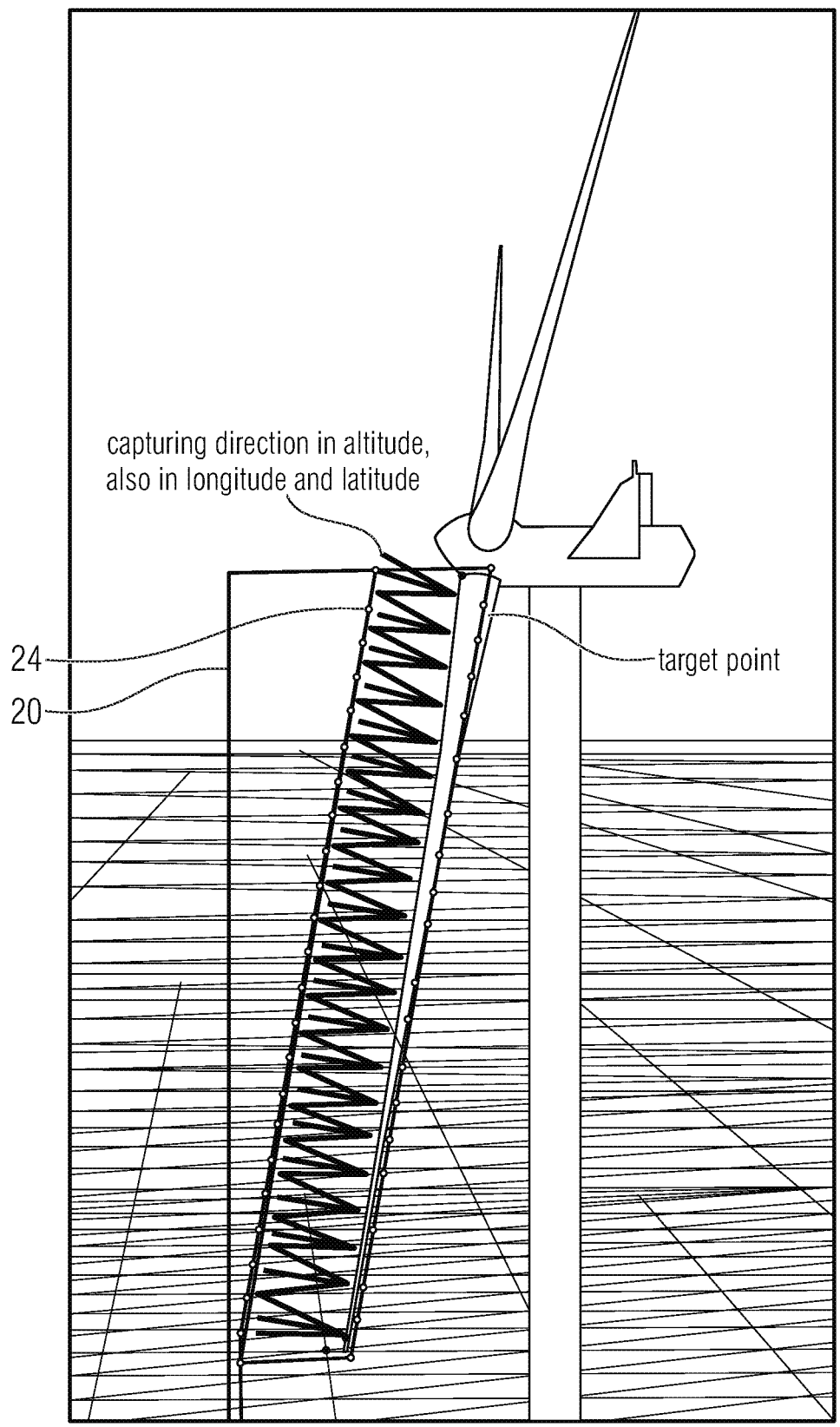
FIG. 6 shows a schematic representation of setting the angles of view of a movable capturing means in accordance with embodiments.

FIG. 6 shows the embodiment of FIG. 4 and FIG. 5. In addition, FIG. 6 shows, by way of example, an alignment of a capturing direction to a target point. The target point may be a point among the set of points of the object from which the surface of the object is spanned in the 3D representation. Alternatively, any other location on the object may be selected. The capturing direction (or heading) designates the orientation of a camera, which is mounted on the drone, for example. Thus, the camera may then be aligned toward the target point (also heading target point) such that said heading target point is arranged, e.g., (as far as possible) in the center of the image being captured. The capturing direction is determined, e.g., via a pitch/roll/yaw angle sensor, i.e., a sensor which measures inclination and rotation of the movable capturing unit. Said sensor may be a (3-axes) gyroscope. In order to focus on the target point, or to take pictures in the direction thereof, a position of the capturing unit may be changed, or the capturing unit may be rotated such as to point to the direction of the target point.

In other words, a goal may be to automatically create air routes (e.g., for inspecting wind power plants by means of drones) on the basis of waypoints within or outside of objects (indoor, buildings, outdoor). To this end, a local coordinate system of the CAD object of the design data (e.g., wind turbine) may be converted to an absolute geographic coordinate system (geo-centered coordinate system, GCC).

Within this context, no relative coordinates are obtained for the first time, but absolute ones are obtained. Each coordinate has a value independent of that of other coordinates. However, the real object may also be measured separately, so that the (lattice) points of the real object are at hand directly in absolute geographic coordinates.

For each lattice point of the CAD object (coordinate), an absolute GPS position is calculated, i.e., the vertices are transferred to GPS (GCC) coordinates. To this end, the specifically developed algorithms Local2GCC and GCC2GDC may be used. On account of modern GPS technologies and utilization of, e.g., RTK (real time kinematic) correction systems, positional accuracies of up to one centimeter are possible. This means that, when converting the coordinates of the object to geographic coordinates as described above, one may automatically generate a flight path along the object, e.g., of a drone, or may interactively determine or change said flight path in a corresponding software engine by simply determining the distance.

The purpose is to place 3D models, which are defined in Cartesian and local coordinates, on a globe by indicating a point on a globe and the coordinate system to be used. This may be effected by implementing, e.g., the above-mentioned functions LOCAL2GCC and GCC2GDC in a 3D-engine software. With LOCAL2GCC, a Cartesian point from the model coordinate system is converted to geocentric coordinates (also Cartesian but relative to the center of the globe). The GCC2GDC function will then convert them to geodetic coordinates (latitude, longitude, altitude).

In practice, this gives way to novel applications for many fields, such as automatic flight of drones (any conceivable flying objects and routes), including touch-down and takeoff without pilot, indoor and outdoor navigation, surveillance, flying-object control with terrain following (surface tracking/terrain tracking) at the same distance from the surface, delivery of goods by means of drones even within densely built-up areas, measuring and inspection of infrastructure such as bridges, high-voltage transmission poles, oil platforms, buildings, industrial complexes, factory plants—indoor and outdoor.

Figure 7:
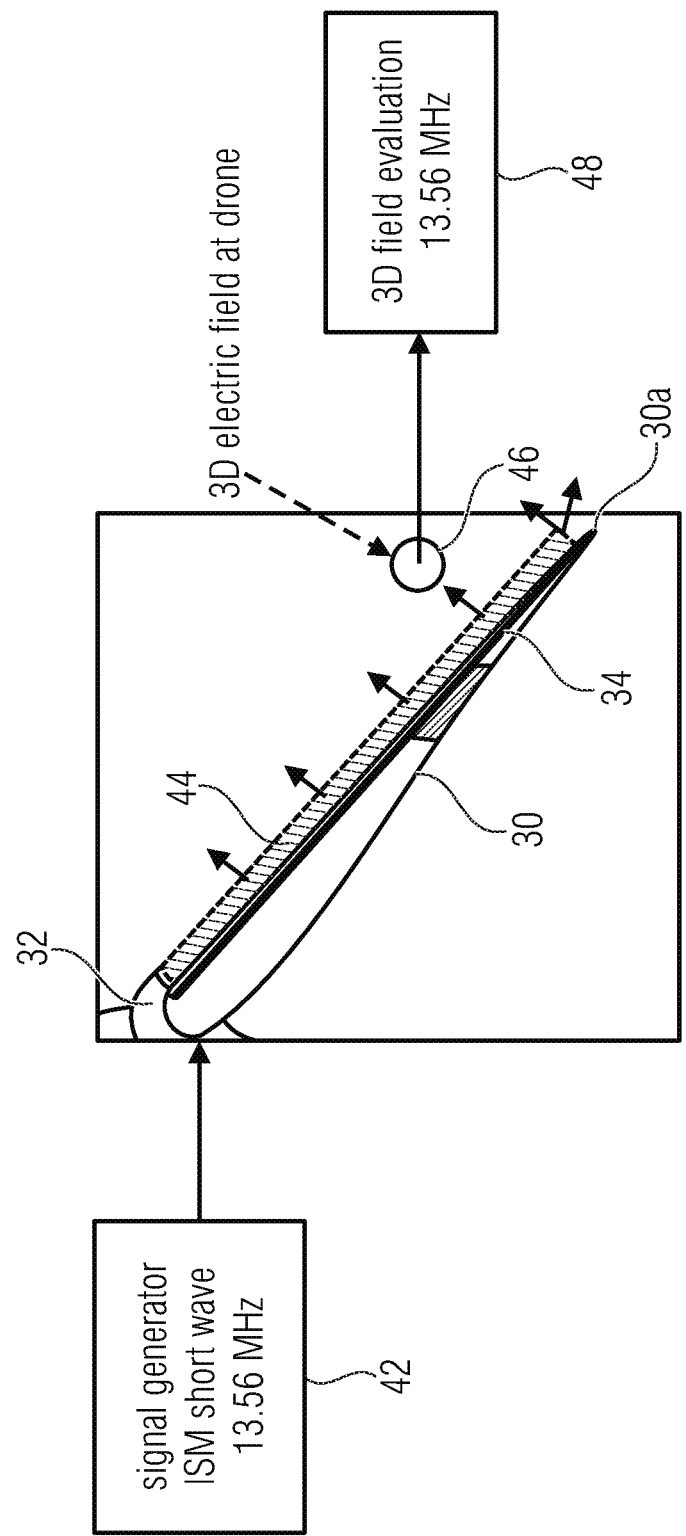
FIG. 7 shows an embodiment in accordance with which the movable capturing unit is configured to sense a field strength of an electric field in a non-contact, or contactless, manner, said electrical field being caused by current flowing within a conductor within an object to be inspected.

FIG. 7 illustrates a further embodiment in accordance with which the movable capturing unit is configured to sense, in a non-touch, or contactless, manner, a field strength of a field radiated off by a conductor within the object to be inspected. This embodiment is illustrated by using the example of a wind turbine, more specifically of measuring protection against lightning. Such measuring of protection against lightning includes a touchless conduction test of the lightning arrester of a rotor blade of the wind turbine, which may be configured, e.g., as a conductor and/or a conductive grid. FIG. 7 shows a rotor blade 30 of a wind turbine that is arranged on the hub 32. The lightning arrester 34 is depicted schematically and extends from the hub 32 almost as far as the tip 30a of the rotor blade 30. The nacelle of the wind turbine has a test system 42 arranged therein which is schematically depicted in FIG. 7 and includes a signal generator which may be connected to the lightning arrester so as to apply a signal to the lightning arrester which causes the field to be sensed. The field 44 generated by the excitation is sensed by a field sensor on a drone 46 flying along the rotor blade 30. In addition, an evaluating unit 48 is provided which is designed to be part of the drone or as a unit arranged at a distance thereof, and which evaluates the field that has been sensed.

Thus, in accordance with this embodiment, the signal applied to the lightning arrester 34 causes a field which is radiated off by the lightning arrester, and on the basis of the radiated-off field, a conduction test of the lightning arrester 34 is performed. The signal is applied, e.g., via the test system 42, to the lightning arrester 34 at the tip of a wind turbine, and the movable capturing unit 46 is configured to measure the field strength within and/or along the lightning arrester. A direction and an intensity of the field strength sensed may be evaluated for determining an interruption of the conductor 34. If the measurement yields a field that is continuous within predetermined tolerances, one will infer a non-interrupted line and/or ground line, i.e., a functional lightning arrester. If the field strength deviates from a predefined range at one or more positions along the conductor, one will infer an interrupted line and/or ground line.

In accordance with the embodiment depicted in FIG. 7, the conductor and/or lightning arrester have a first end to which the signal may be applied by the test system, and a second end that is open, or is on no load. Thus, the conductor forms a dipole, and the signal generator of the test system 42 advantageously operates at a frequency of 13.56 MHz within the ISM short-wave band. Excitation of the conductor by an alternating current or an alternating voltage from the signal generator causes a standing wave along the conductor and an alternating electric field 44 that is perpendicular to the conductor. The electric field 44 is sensed by a field sensor, advantageously a 3D electric-field sensor, on a drone 46 which flies along the rotor blade 30. The evaluating unit 48 evaluates the alternating electric field that has been sensed (frequency=13.56 MHz) in the above-described manner.

In accordance with another embodiment, the conductor and/or lightning arrester is a closed conductor loop. The signal generator of the test system 42 applies a signal, e.g., a direct current or a direct voltage, to the conductor loop so as to cause a flow of current within the conductor loop. The flow of current causes an electromagnetic field surrounding the conductor. The electromagnetic field is sensed by a field sensor, advantageously a 3D EM field sensor, on the drone which flies along the rotor blade. The evaluating unit 48 evaluates the electromagnetic field that has been sensed in the above-described manner.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device. Some or all of the method steps may be performed by a hardware device (or while using a hardware device) such as a microprocessor, a programmable computer or an electronic circuit, for example. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier. In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU) or a graphics card (GPU), or may be a hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A computer implemented method of inspecting an object, comprising:

moving an airborne, land or water vehicle on a path along the object;

inducing a stimulus signal in a conductor of the object, wherein the conductor is arranged at or underneath a surface of the object;

sensing a response signal to the stimulus signal within the conductor using the airborne, land or water vehicle; and evaluating the signal in order to obtain an information about the conductor;

wherein the object is a wind turbine, wherein the conductor is a lightning arrester of a rotor of the wind turbine, wherein the sensing of the response signal comprises measuring the field strength radiated from the lightning arrester, and wherein the inducing of the stimulus signal comprises applying a voltage to the lightning arrester.

2. The computer implemented method as claimed in claim 1, wherein said sensing of the response signal comprises a contactless sensing of the field strength of the field radiated off by the conductor.

3. The computer implemented method as claimed in claim 2, wherein the field strength of the field is sensed along the conductor at predefined intervals or continuously.

4. The computer implemented method as claimed in claim 2, comprising evaluating the field strength sensed along the conductor so as to determine an interruption of the conductor.

5. The computer implemented method as claimed in claim 2, wherein a direction and intensity of the sensed field strength are evaluated so as to determine an interruption of the conductor.

6. The computer implemented method as claimed in claim 1, wherein the conductor is a closed conductor loop, wherein the stimulus signal applied to the conductor loop causes a flow of current within the conductor loop, which flow of current causes an electromagnetic field; and wherein the sensing of the response signal comprises a sensing of the electromagnetic field.

7. The computer implemented method as claimed in claim 1, wherein the conductor comprises a first end to which a signal may be applied, and a second, open end, so that the conductor acts as a dipole or a monopole, wherein the signal applied to the first end comprises a predetermined frequency so as to generate a standing wave which causes an electric field; and wherein the sensing of the response signal comprises a sensing of the electric field.

8. The computer implemented method as claimed in claim 1, wherein the path is specified on the basis of a model of the object, and wherein local coordinates of the model are converted via at least one reference point in absolute coordinates, to absolute coordinates for controlling the airborne, land or water vehicle based on the absolute coordinates.

9. The computer implemented method as claimed in claim 1, wherein at least a section of the path is adapted and/or determined in real time based on a distance from the object that is to be maintained.

10. The computer implemented method as claimed in claim 1, further comprising:

generating a sequence of pictures of the object whilst sensing the response signal; and evaluating the sequence of pictures in order to adapt and/or to determine at least a section of the path in real time and/or in order to obtain an information about the object.

11. The computer implemented method as claimed in claim 9, further comprising:

defining, along the path, trigger locations for the airborne, land or water vehicle; and generating an image at the trigger locations and/or sensing the response signal at the trigger locations.

12. The computer implemented method as claimed in claim 1, further comprising:

generating a sequence of pictures of the object; and projecting the pictures of the object onto a model of the object so as to acquire a model exhibiting the current surface of the object.

13. The computer implemented method as claimed in claim 12, wherein said projection is effected on the basis of a current position and of a capturing direction of the airborne, land or water vehicle at a time of capturing.

14. The computer implemented method as claimed in claim 1, wherein at least one of the moving of the airborne, land or water vehicle on the path along the object, the inducing of the stimulus signal in the conductor of the object, the sensing of the response signal and/or the evaluating of the signal in order to obtain an information about the conductor, is performed automatically or autonomously.

15. The computer implemented method as claimed in claim 1, wherein at least a section of the path is predetermined based on a conversion of points of a model of the object in relative coordinates to points in absolute coordinates using a reference point of the object in absolute coordinates; and wherein at least a section of the path is determined and/or adapted in real time based on a distance from the object that is to be maintained.

16. A system for automatically inspecting an object, the system comprising:

an airborne, land or water vehicle, configured to move on a path along an object and to sense a response signal to a stimulus signal within a conductor of the object; and a processor implemented in hardware and configured to evaluate the signal in order to obtain an information about the conductor, wherein the object is a wind turbine, wherein the conductor is a lightning arrester of a rotor of the wind turbine, wherein the airborne, land or water vehicle is configured to measure the field strength radiated from the lightning arrester for sensing the response signal, and wherein the inducing of the stimulus signal comprises applying a voltage to the lightning arrester.

17. The system as claimed in claim 16, further comprising:

a signal generator configured to induce the stimulus signal in the conductor of the object.

18. A non-transitory digital storage medium having a computer program stored thereon to perform a computer-implemented method of determining a path along an object, said method comprising:

moving an airborne, land or water vehicle on a path along the object;

inducing a stimulus signal in a conductor of the object, wherein the conductor is arranged at or underneath a surface of the object;

sensing a response signal to the stimulus signal within the conductor using the airborne, land or water vehicle; and evaluating the signal in order to obtain an information about the conductor;

wherein the object is a wind turbine, wherein the conductor is a lightning arrester of a rotor of the wind turbine, wherein the sensing of the response signal comprises measuring the field strength radiated from the lightning arrester, and wherein the inducing of the stimulus signal comprises applying a voltage to the lightning arrester.

* * * * *